(12) United States Patent
Negishi et al.

(10) Patent No.: US 7,557,560 B2
(45) Date of Patent: Jul. 7, 2009

(54) TIMING GENERATOR AND TEST DEVICE

(75) Inventors: Toshiyuki Negishi, Tokyo (JP); Naoki Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 149 days.

(21) Appl. No.: 11/256,202

(22) Filed: Oct. 21, 2005

(65) Prior Publication Data

US 2006/0087308 A1   Apr. 27, 2006

Related U.S. Application Data

(63) Continuation of application No. PCT/JP2005/018709, filed on Oct. 11, 2005.

(30) Foreign Application Priority Data

Oct. 13, 2004   (JP) .............................. 2004-299321

(51) Int. Cl.
  *G01R 23/175*  (2006.01)
  *G01R 13/30*   (2006.01)
  *H03H 11/26*   (2006.01)
(52) U.S. Cl. .................... 324/76.54; 333/138; 327/261
(58) Field of Classification Search ............... 324/76.54
   See application file for complete search history.

(56) References Cited

U.S. PATENT DOCUMENTS

| 5,293,080 | A | * | 3/1994 | Hiwada et al. | ............... | 327/141 |
| 6,058,057 | A | * | 5/2000 | Ochiai et al. | ................ | 365/201 |
| 6,269,051 | B1 | * | 7/2001 | Funaba et al. | ............... | 365/233 |
| 7,010,729 | B2 | * | 3/2006 | Doi et al. | ..................... | 714/700 |
| 7,034,518 | B2 | * | 4/2006 | Yamamoto | ............... | 324/158.1 |
| 7,453,302 | B2 | * | 11/2008 | Le et al. | ..................... | 327/262 |
| 2002/0190706 | A1 | * | 12/2002 | Ebiya | ..................... | 324/158.1 |
| 2003/0137330 | A1 | * | 7/2003 | Yazawa et al. | .............. | 327/161 |
| 2003/0140286 | A1 | * | 7/2003 | Shinbo et al. | ............... | 714/699 |
| 2005/0228611 | A1 | * | 10/2005 | Kim | .......................... | 702/130 |
| 2006/0203589 | A1 | * | 9/2006 | Lee | ............................ | 365/222 |

FOREIGN PATENT DOCUMENTS

| JP | 11-304888 A | 11/1999 |
| JP | 2002-261592 A | 9/2002 |
| JP | 2003-279629 A | 10/2003 |

OTHER PUBLICATIONS

Patent Abstracts of Japan, Publication No. 2002-261592, Publication Date: Sep. 13, 2002; (1 page).
Patent Abstracts of Japan, Publication No. 2003-279629; Publication Date: Oct. 2, 2003 (2 pages).
Patent Abstracts of Japan, Publication No. 11-304888; Publication Date: Nov. 5, 1999 (2 pages).
International Search Report for PCT/JP2005/018709 dated Jan. 17, 2006 (2 pages).

* cited by examiner

*Primary Examiner*—Vincent Q Nguyen
*Assistant Examiner*—John Zhu
(74) *Attorney, Agent, or Firm*—Osha • Liang LLP

(57) ABSTRACT

There is provided a timing generator for generating a timing signal based on a given reference clock, having a delaying circuit section for outputting each pulse of the reference clock by delaying by a value of delay given per each of the pulse and a pulse selecting and outputting section for passing and outputting only pulses to be outputted as the timing signal among the pulses outputted out of the delaying circuit section.

8 Claims, 4 Drawing Sheets

TIMING GENERATOR AND TEST DEVICE

REFERENCE TO RELATED APPLICATION

This is a continuation application of PCT/JP2005/018709 filed on Oct. 11, 2005 which claims priority from a Japanese Pat. Application No. JP2004-299321 filed on Oct. 13, 2004, the contents of which are incorporated herein by reference.

BACKGROUND OF THE INVENTION

1. Technical Field

The present invention relates to a timing generator for generating a timing signal based on a given reference clock and to a test apparatus having the timing generator. More specifically, the invention relates to a timing generator whose calorific value is stabilized.

2. Related Art

Operating speed of electronic devices such as LSI is improving lately. With that, it has become necessary to generate a high precision clock in a test apparatus and the like for testing such electronic devices. Conventionally, in order to generate a clock having a desirable pattern, there has been known a circuit having a logic gate that passes desirable pulses among pulses of a reference clock and a delaying circuit for modulating phases of the respective pulses.

However, such circuit causes a problem that a number of pulses and pattern of pulses passing through the delaying circuit vary corresponding to the pattern of the pulses selected by the logical gate and that a calorific value in the delaying circuit varies as a result. Due to that, a value of delay in the delaying circuit fluctuates, causing jitter in the clock to be generated. Such jitter is not permissible in the high precision LSI and the like.

Then, as a circuit that is capable of solving the above-mentioned problem, there has been known a circuit further including a dummy delaying circuit.

This circuit keeps a total calorific value in those delaying circuits constant regardless of the pattern of the clock to be generated by inputting pulses not inputted to the delaying circuit for generating the clock among pulses of the given reference clock to the dummy delaying circuit.

The applicant of the invention is presently unaware of existence of any related patent document or the like, so that their description will be omitted here.

However, because the conventional circuit needs to be provided with the dummy delaying circuit which is identical with the delaying circuit for generating the clock in order to keep the calorific value constant as described above, a size of the circuit increases. Still more, while it is necessary to provide the delaying circuit for generating the clock in the vicinity of the dummy delaying circuit to keep the temperature of the delaying circuit for generating the clock constant, there is also a problem that a signal in the dummy delaying circuit interferes with a signal in the delaying circuit for generating the clock, causing jitter in the clock to be generated. For example, phase of the pulses passing through the delaying circuit for generating the clock becomes almost identical with phase of the pulses passing through the dummy delaying circuit and causes interference depending on setting of the value of delay in the delaying circuit for generating the clock.

Accordingly, it is an object of the invention to provide a timing generator and a test apparatus capable of solving the above-mentioned problems. This object may be achieved through the combination of features described in independent claims of the invention. Dependent claims thereof specify preferable embodiments of the invention.

SUMMARY OF THE INVENTION

In order to solve the above-mentioned problems, according to a first aspect of the invention, there is provided a timing generator for generating a timing signal based on a given reference clock, having a delaying circuit section for outputting each pulse of the reference clock by delaying by a value of delay given per each of the pulse and a pulse selecting and outputting section for passing and outputting only pulses to be outputted as the timing signal among the pulses outputted out of the delaying circuit section.

The timing generator may further include a delay control section for incorporating delay setting data for controlling a value of delay in the delaying circuit section corresponding to the pulse outputted out of the delaying circuit section and for controlling the value of delay in the delaying circuit section based on the incorporated delay setting data.

The delaying circuit section may have a plurality of cascade-connected delay elements, the delay control section may have a plurality of delay setting flip-flops provided corresponding to the plurality of delay elements and each of the delay setting flip-flops may incorporate the delay setting data corresponding to pulse outputted out of corresponding delay element and may control the value of delay of the corresponding delay element based on the incorporated delay setting data.

The timing generator may further include a pulse selecting flip-flop for feeding a pulse selecting signal specifying whether the pulse is to be passed to the pulse selecting and outputting section corresponding to the pulse outputted out of the delay element at the final stage.

The timing generator may further include a pulse selection control section that receives a pulse selecting signal that indicates a logical value H in passing the pulse in the pulse selecting and outputting section and indicates a logical value L in passing no pulse in synchronism with the pulse of the reference clock given to the delaying circuit section to feed the pulse selecting signal to the pulse selecting and outputting section, the pulse selection control section may have a plurality of pulse selecting flip-flops cascade-connected and provided corresponding to the plurality of delay elements to sequentially incorporate and output the pulse selecting signal corresponding to the pulse outputted out of the corresponding delay element and each of the delay setting flip-flops may not newly incorporate the delay setting data during when the corresponding pulse selecting flip-flop outputs the logical value L.

The timing generator may further include a temperature compensation selecting section for controlling if all pulses of the reference clock are to be inputted to the delaying circuit section or only pulses to be outputted as the timing signal are to be inputted to the delaying circuit section.

The temperature compensation selecting section may feed a signal fixed to the logical value H as the pulse selecting signal to the pulse selection control section when only pulses to be outputted as the timing signal are to be inputted to the delaying circuit section.

According to a second aspect of the invention, there is provided a test apparatus for testing an electronic device, having a pattern generating section for generating a test pattern to be fed to the electronic device, a timing generator for generating a timing signal for controlling timing for feeding the test pattern to the electronic device based on a given reference clock, a waveform shaper for feeding the test pattern to the electronic device corresponding to the timing signal and a judging device for judging whether the electronic device is defect-free based on an output signal outputted out of the electronic device, wherein the timing generating section has a delaying circuit section for outputting each pulse of the reference clock by delaying by a value of delay given per each pulse and a pulse selecting and outputting section for passing and outputting only pulses to be outputted as the timing signal among the pulses outputted out of the delaying circuit section.

It is noted that the summary of the invention described above does not necessarily describe all necessary features of the invention. The invention may also be a sub-combination of the features described above.

According to the invention, the timing signal having a desirable pattern may be generated with less jitter.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
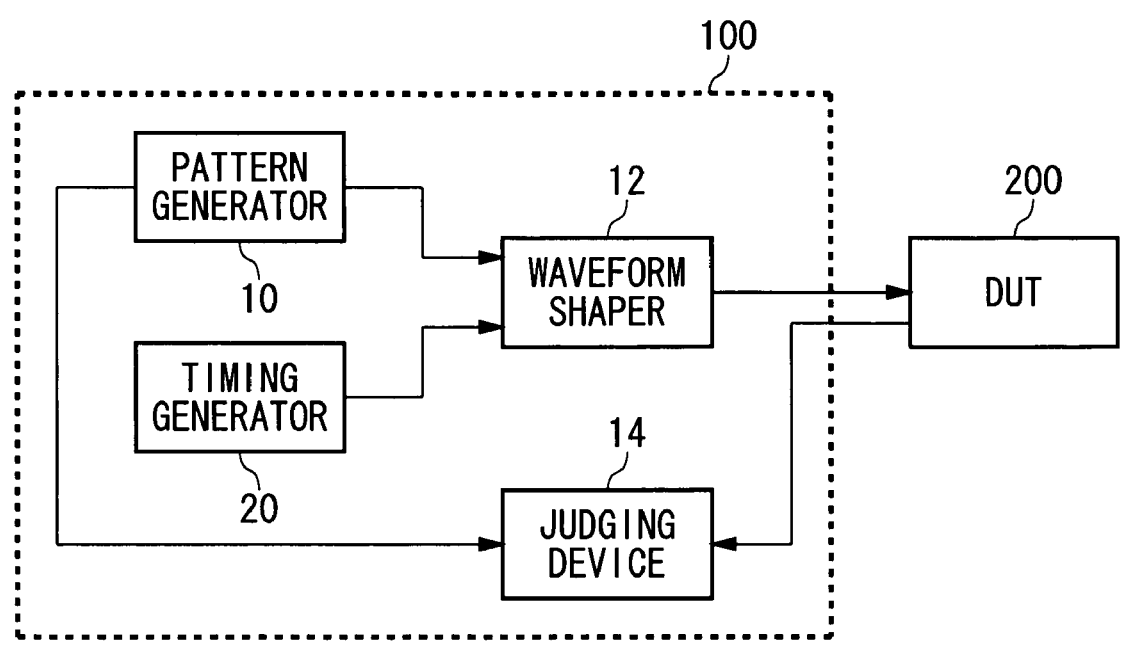
FIG. 1 is a diagram showing one exemplary configuration of a test apparatus according to an embodiment of the invention.

FIG. 1 is a diagram showing one exemplary configuration of a test apparatus 100 according to an embodiment of the invention. The test apparatus 100 is an apparatus for testing an electronic device 200 such as a semiconductor circuit and includes a pattern generator 10, a waveform shaper 12, a judging device 14 and a timing generator 20.

The pattern generator 10 generates a test pattern for testing the electronic device 200. The test pattern is a digital signal represented by a pattern of 1/0 for example. The waveform shaper 12 generates an input signal to be inputted to the electronic device 200 based on the test pattern. For example, the waveform shaper 12 generates the input signal having a voltage value corresponding to the test pattern per given timing.

The timing generator 20 generates a timing clock having a desirable pattern and feeds it to the waveform shaper 12. The waveform shaper 12 generates voltage corresponding to the test pattern corresponding to the pulse of the timing clock. The judging device 14 compares a signal outputted out of the electronic device 200 with a given expected value signal to judge whether the electronic device 200 is defect-free. The pattern generator 10 may generate the expected value signal based on the test pattern.

Figure 2:
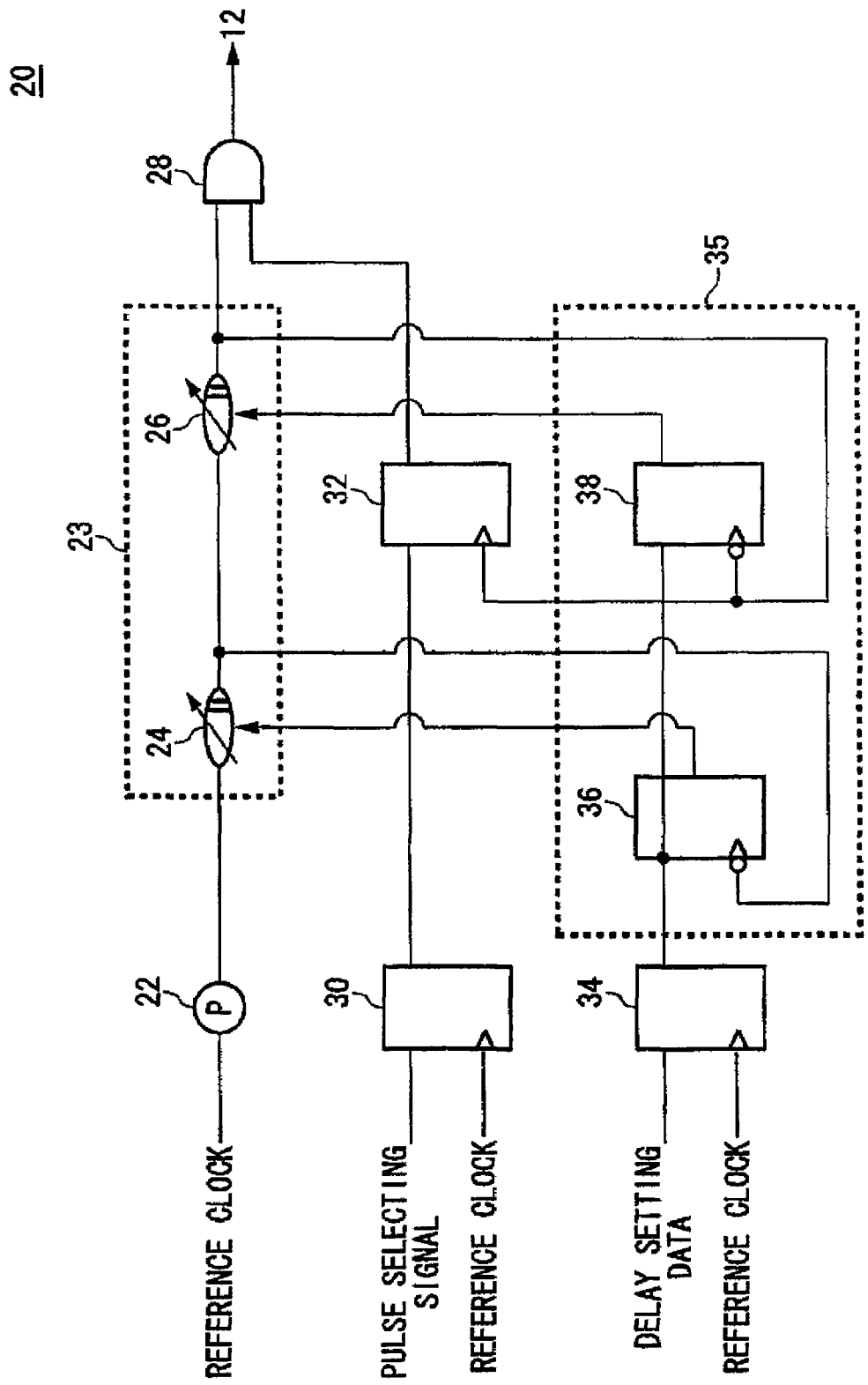
FIG. 2 is a diagram showing one exemplary configuration of a timing generator.

FIG. 2 is a diagram showing one exemplary configuration of the timing generator 20. The timing generator 20 is a circuit for generating a timing signal based on a given reference clock and has a delaying circuit section 23, a pulse selecting and outputting section 28, a pulser 22, a delay control section 35, a pulse selecting flip-flop 32, a flip-flop 30 and a flip-flop 34. The timing generator 20 also receives a reference clock of predetermined frequency as well as a pulse selecting signal and delay setting data corresponding to a pattern of the timing signal to be outputted.

The pulser 22 receives the reference clock and outputs it by modulating a pulse width of the reference clock to a predetermined pulse width.

The delaying circuit section 23 outputs the reference clock outputted out of the pulser 22 by delaying each pulse by a value of delay given per each pulse.

That is, the delaying circuit section 23 controls the phase of each pulse corresponding to the given delay setting data.

The delaying circuit section 23 of the present embodiment has a plurality of cascade-connected delay elements 24 and 26. A maximum value of delay in the delay element 26 is almost equal to delay resolution in the delay element 24 for example and the delaying circuit section 23 controls the phase of each pulse by a sum of the values of delay of the delay elements 24 and 26.

The pulse selecting and outputting section 28 passes and outputs only pulses to be outputted as the timing signal among the pulses outputted out of the delaying circuit section 23. In the present embodiment, the pulse selecting and outputting section 28 is an AND circuit and outputs AND of the pulse outputted out of the delaying circuit section 23 and a pulse selecting signal fed from the pulse selecting flip-flop 32.

The pulse selecting signal is mask data that indicates 1 at timing of pulse to be outputted and indicates 0 at timing of pulse not outputted.

Such configuration allows a calorific value of the delaying circuit section 23 to be kept constant and the timing signal having less jitter to be generated with a small size circuit regardless of the pattern of the timing signal to be outputted.

The flip-flop 30 receives the pulse selecting signal and outputs it to the pulse selecting flip-flop 32 in synchronism with the reference clock.

That is, the flip-flop 30 receives the pulse selecting signal through its data input terminal and receives the reference clock through its clock input terminal. The pulse selecting signal is a signal indicating whether each pulse of the reference clock is to be outputted as the timing signal and is given to the flip-flop 30 in synchronism with the corresponding pulse.

The pulse selecting flip-flop 32 feeds the pulse selecting signal to the pulse selecting and outputting section 28 corresponding to the pulse outputted out of the final delay element in the delaying circuit section 23, i.e., the delay element 26. That is, the pulse selecting flip-flop 32 receives the pulse selecting signal through its data input terminal and receives the signal outputted out of the delay element 26 through its clock input terminal. Such configuration allows the pulse selecting and outputting section 28 to control whether or not each pulse of the reference clock is to be passed regardless of the value of delay in the delaying circuit section 23.

The timing generator 20 may further include a delay element whose value of delay is fixed to a predetermined value between the delaying circuit section 23 and the pulse selecting and outputting section 28 so that the pulse selecting signal outputted out of the pulse selecting flip-flop 32 has an enough set up time to the pulses outputted out of the delaying circuit section 23.

The flip-flop 34 receives the delay setting data and outputs it to the delay control section 35 in synchronism with the reference clock.

That is, the flip-flop 34 receives the delay setting data through its data input terminal and receives the reference clock through its clock input terminal. The delay setting data is data specifying a value of delay for each pulse of the reference clock and is fed to the flip-flop 34 in synchronism with preceding pulse of the corresponding pulse.

The delay control section 35 incorporates the delay setting data for controlling the value of delay in the delaying circuit section 23 corresponding to the pulse outputted out of the delaying circuit section 23 and controls the value of delay in the delaying circuit section 23 based on the incorporated delay setting data. The delay control section 35 has a plurality of delay setting flip-flops 36 and 38 provided corresponding to the plurality of delay elements 24 and 26 in the present embodiment.

Each of the delay setting flip-flops 36 and 38 incorporates the delay setting data corresponding to the pulse outputted out of the corresponding delay element 24 or 26 and controls the value of delay of the corresponding delay element 24 or 26 based on the incorporated delay setting data. That is, every time when the delay element 24 or 26 outputs a pulse, the delay setting flip-flop 36 or 38 sets the value of delay for delaying the next pulse in each delay element 24 or 26. Such operation allows the value of delay for each pulse to be set accurately.

Still more, the maximum value of delay in the delay element 26 is almost equal to the delay resolution in the delay element 24 as described above. Then, when the delay element 24 generates a coarse delay and the delay element 26 generates a precision delay, the delay setting flip-flop 36 corresponding to the delay element 24 controls the value of delay in the delay element 24 based on upper bits of data outputted out of the delay setting flip-flop 34 and the delay setting flip-flop 38 corresponding to the delay element 26 controls the value of delay in the delay element 26 based on lower bits of the data outputted out of the delay setting flip-flop 34.

In the present embodiment, each of the delay setting flip-flops 36 and 38 receives the delay setting data through its data input terminal and receives the signal outputted out of the corresponding delay element 24 or 26 through its clock input terminal.

Still more, although the case when the reference clock fed to the timing generator 20 has a constant period has been explained in the present embodiment, the timing generator 20 can generate an output signal having a desirable pattern from an input signal having a desirable pattern.

Figure 3:
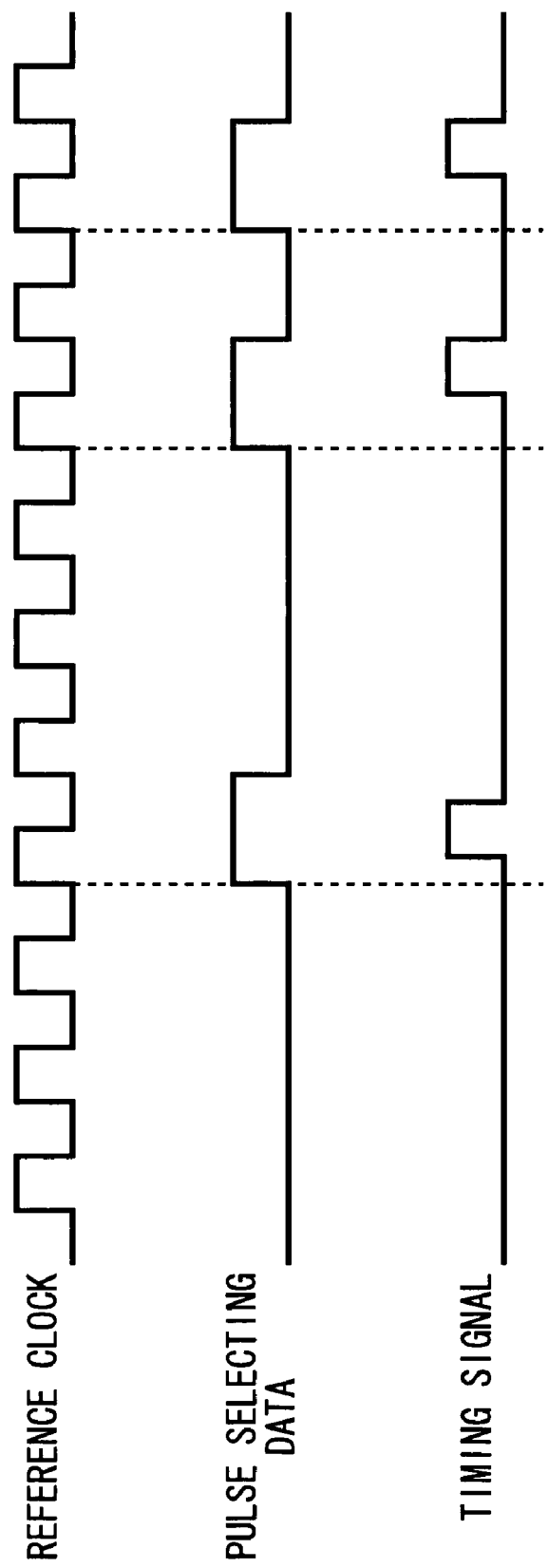
FIG. 3 is a timing chart showing one exemplary operation of the timing generator.

FIG. 3 is a timing chart showing one exemplary operation of the timing generator 20. The reference clock having a constant period as shown in FIG. 3 is fed to the delaying circuit section 23. The delaying circuit section 23 delays each pulse of the reference clock by the value of delay given per each pulse. At this time, the delay setting data that meets a condition that the respective pulses of the delayed reference clock are not close proximity from each other is fed to the delaying circuit section 23.

Then, the pulse selecting and outputting section 28 outputs AND of the pulse selecting data indicating whether or not each pulse is to be outputted and the reference clock delayed by the delaying circuit section 23 to generate a timing signal having a desirable pattern as shown in FIG. 3.

Because the timing generator 20 of the present embodiment can keep the calorific value almost constant as described above, jitter may be reduced. Still more, because the timing generator 20 requires no dummy delaying circuit for keeping the calorific value constant, it can eliminate the interference caused by the pulse transmitting through the dummy delaying circuit and can generate the timing signal accurately.

Figure 4:
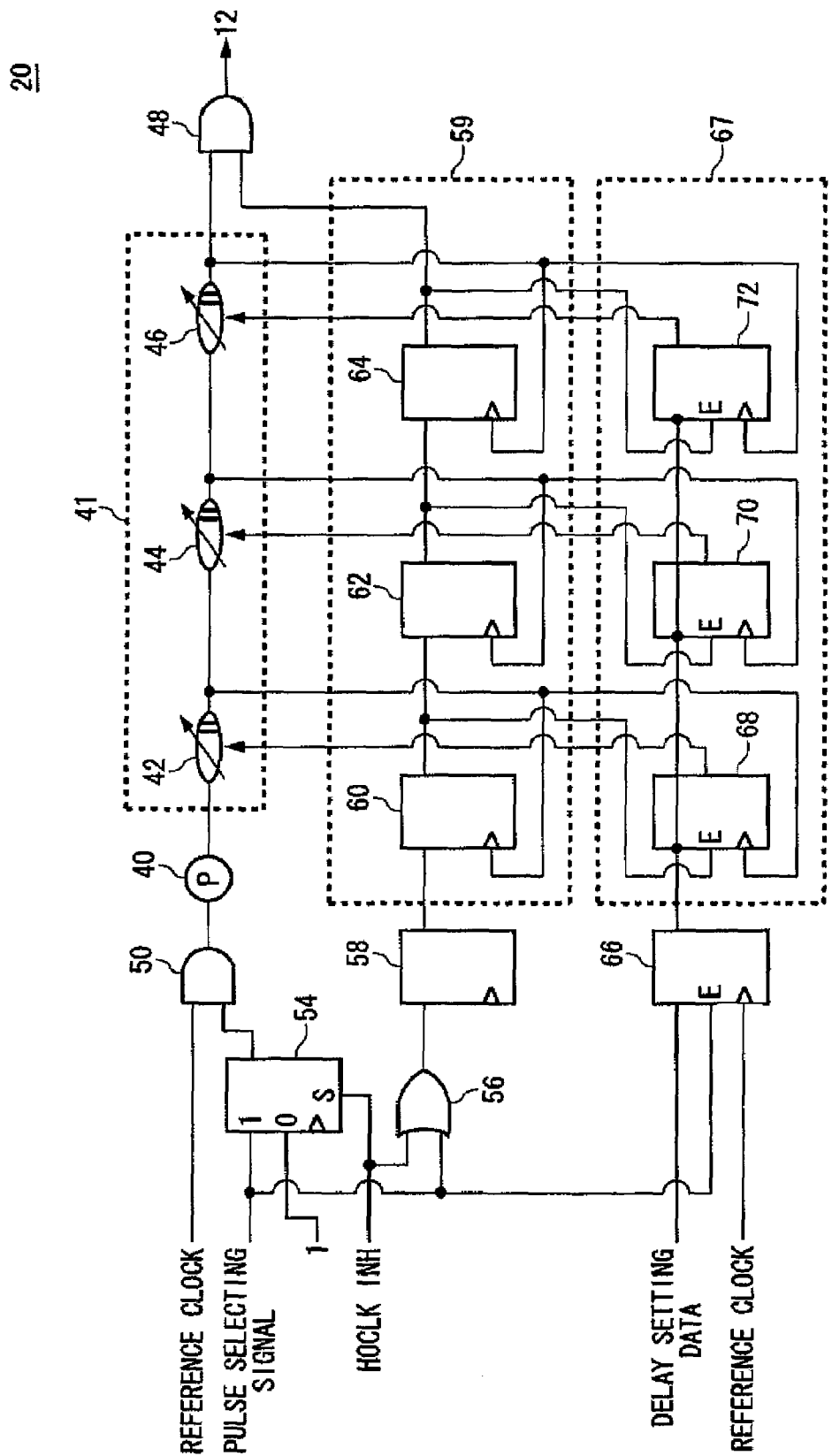
FIG. 4 is a diagram showing another exemplary configuration of the timing generator.

FIG. 4 is a diagram showing another exemplary configuration of the timing generator 20. The timing generator 20 of the present embodiment has a delaying circuit section 41, a pulse selecting and outputting section 48, a pulser 40, a delay control section 67, a pulse selection control section 59, a flip-flop 58, a flip-flop 66, a temperature compensation selecting section 54, a pulse selecting and inputting section 50 and an OR circuit 56.

The pulser 40, the delaying circuit section 41, the pulse selecting and outputting section 48, the pulse selection control section 59 and the delay control section 67 have the same functions and configurations with the pulser 22, the delaying circuit section 23, the pulse selecting and outputting section 28, the pulse selecting flip-flop 32 and the delay control section 35 explained in connection with FIG. 2.

Their configuration will be explained at first.

The pulser 40 modulates a pulse width of a given signal into a predetermined pulse width and outputs it to the delaying circuit section 41. The delaying circuit section 41 has the same function and configuration with the delaying circuit section 23 explained in connection with FIG. 2. The delaying circuit section 41 of the present embodiment has a plurality of cascade-connected delay elements 42, 44 and 46. Similarly to the delaying circuit section 23, a maximum value of delay of the delay element 44 may be almost equal to a delay resolution of the delay element 42 and a maximum value of delay of the delay element 46 may be almost equal to a delay resolution of the delay element 44.

The pulse selection control section 59 receives a pulse selecting signal that indicates a logical value H in passing a pulse of the reference clock in the pulse selecting and outputting section 48 and a logical value L in passing no pulse in synchronism with the pulse of the reference clock and feeds the pulse selecting signal to the pulse selecting and outputting section 48. Similarly to the pulse selecting and outputting section 28 explained in connection with FIG. 2, the pulse selecting and outputting section 48 outputs AND of the signal outputted out of the delaying circuit section 41 and the pulse selecting signal received from the pulse selection control section 59.

The pulse selection control section 59 has a plurality of pulse selecting flip-flops 60, 62 and 64 cascade-connected and provided corresponding to the plurality of delay elements 42, 44 and 46. Each of the pulse selecting flip-flops 60, 62 and 64 sequentially incorporates the pulse selecting signal and outputs to the next step corresponding to the pulse outputted out of the corresponding delay element. Such configuration allows the transmission of the pulse selecting signal to be delayed corresponding to the value of delay of each of the delay elements 42, 44 and 46 and allows the pulse selecting and outputting section 48 to accurately generate the timing signal.

The delay control section 67 also has the same function and configuration with the delay control section 35 explained in connection with FIG. 2. The delay control section 67 in the present embodiment has a plurality of delay setting flip-flops 68, 70 and 72 provided corresponding to the plurality of delay elements 42, 44 and 46. That is, the plurality of delay setting flip-flops 68, 70 and 72 are provided corresponding also to the plurality of pulse selecting flip-flops 60, 62 and 64.

The flip-flop 66 also receives the delay setting data through its data input terminal, receives the pulse selecting signal through its enable terminal and receives the reference clock through its clock input terminal. That is, the flip-flop 66 incorporates the delay setting data and inputs it to the delay control section 67 corresponding to the pulse of the reference clock to be outputted as the timing signal.

Each of the delay setting flip-flops 68, 70 and 72 does not newly incorporate the delay setting data during when the corresponding pulse selecting flip-flop 60, 62 or 64 outputs the logical value L. That is, each of the delay setting flip-flops

68, 70 and 72 receives the delay setting data through its data input terminal, receives the signal outputted out of the corresponding delay element 42, 44 or 46 through its clock input terminal and receives the signal outputted out of the corresponding pulse selecting flip-flop 60, 62 or 64 through its enable terminal. That is, each delay setting flip-flop delays pulse not outputted in the pulse selecting and outputting section 48 by the same value of delay with that of the preceding pulse. Such configuration allows the timing signal to be readily generated because it is not necessary to consider the proximity condition of the pulse outputted as the timing signal and the pulses thereafter not outputted as the timing signal.

The temperature compensation selecting section 54 controls whether all of the pulses of the reference clock are to be inputted to the delaying circuit section 41 or only pulses to be outputted as the timing signal are to be inputted to the delaying circuit section 41.

That is, the temperature compensation selecting section 54 selects whether the timing signal is to be generated while keeping the calorific value in the timing generator 20 almost constant or the timing signal is to be generated without controlling the calorific value.

While there is a case when a high precision timing signal is required or when a timing signal is required at low power consumption depending on the uses of the timing signal, such control enables one to select to generate the high precision timing signal by controlling the calorific value in the delaying circuit section 41 or to generate the timing signal at low power consumption.

The temperature compensation selecting section 54 receives the pulse selecting signal described above in FIG. 2, the signal fixed at the logical value H and a temperature compensation selecting signal (HOCLK INH) indicating whether the temperature is to be controlled in the delaying circuit section 41. In the present embodiment, the temperature compensation selecting signal is a signal indicating a logical value L when the temperature control is carried out and a logical value H when no temperature control is carried out. Then, the temperature compensation selecting section 54 outputs the signal fixed to the logical value H when the temperature compensation selecting signal is the signal indicating that the temperature control is carried out and outputs the pulse selecting signal when the temperature compensation selecting signal is the signal indicating that no temperature control is carried out.

The pulse selecting and inputting section 50 inputs AND of the given reference clock and the signal outputted out of the temperature compensation selecting section 54 to the delaying circuit section 41 via the pulser 40. That is, when no temperature control is carried out, only the pulses to be outputted as the timing signal are inputted to the delaying circuit section 41 and all pulses of the reference clock are inputted as described above when the temperature control is to be carried out.

The OR circuit 56 feeds OR of the pulse selecting signal and the temperature compensation selecting signal to the flip-flop 58. That is, the pulse selecting signal is fed to the flip-flop 58 when the temperature control is carried out. At this time, the flip-flop 58 and the pulse selection control section 59 operate as described above.

When no temperature control is carried out, the temperature compensation selecting section 54 feeds the signal fixed to the logical value H to the pulse selection control section 59 as the pulse selecting signal via the OR circuit 56 and the flip-flop 58. The pulse selection control section 59 outputs the signal fixed to the logical value H under such control, so that the pulse selecting and outputting section 48 passes the signal outputted out of the delaying circuit section 41 as it is. Therefore, the pulses already selected in the pulse selecting and inputting section 50 may be passed.

The signal fixed to the logical value H is inputted to the enable terminal of each of the delay setting flip-flops 68, 70 and 72 to incorporate new delay setting data every time when the corresponding delay element 42, 44 or 46 outputs the pulse to control the value of delay of the corresponding delay element. Therefore, phase of the pulse to be outputted as the timing signal may be controlled without error.

The timing generator 20 of the present embodiment can realize an apparatus having an operation mode of generating the timing signal having less jitter and an operation mode of generating the timing signal with low power consumption with the small circuit configuration.

Still more, the test apparatus 100 may have a plurality of configurations of the timing generator 20 described above. In this case, each of the timing generators 20 generates a timing signal having a different pattern. Then, the waveform shaper 12 may generate a plurality of input signals having different patterns, may have circuits for inputting to each pin of the electronic device 200 and may have a multiplexer for selecting which timing signal is to be used for which circuit.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

INDUSTRIAL APPLICABILITY

As it is apparent from the above description, according to the invention, the timing signal having a desirable pattern may be generated with less jitter.

What is claimed is:

1. A timing generator for generating a timing signal based on a given reference clock, comprising:
   a delaying circuit section for outputting each pulse of said reference clock by delaying by a value of delay given per each of said pulse;
   a pulse selecting and outputting section for passing and outputting only pulses to be outputted as said timing signal among the pulses outputted out of said delaying circuit section; and
   a delay control section for incorporating delay setting data for controlling a value of delay in said delaying circuit section corresponding to the pulse outputted out of said delaying circuit section and for controlling the value of delay in said delaying circuit section based on said incorporated delay setting data,
   wherein said delaying circuit section has a plurality of cascade-connected delay elements; said delay control section has a plurality of delay setting flip-flops provided corresponding to said plurality of delay elements; and each of said delay setting flip-flops incorporates said delay setting data corresponding to the pulse outputted out of the corresponding delay element and controls the value of delay of said corresponding delay element based on said incorporated delay setting data,
   the timing generator further comprising a pulse selection control section that receives a pulse selecting signal that indicates a logical value H in passing the pulse in said pulse selecting and outputting section and indicates a logical value L in passing no pulse in synchronism with the pulse of the reference clock given to said delaying circuit section to feed said pulse selecting signal to said pulse selecting and outputting section, wherein said pulse selection control section has a plurality of pulse selecting flip-flops cascade-connected and provided corresponding to said plurality of delay elements to sequentially incorporate and output said pulse selecting signal corresponding to the pulse outputted out of said corresponding delay element, and wherein each of said delay setting flip-flops does not newly incorporate said delay setting data during when said corresponding pulse selecting flip-flop outputs the logical value L.

2. The timing generator as set forth in claim 1, further comprising a temperature compensation selecting section for selecting whether all pulses of said reference clock are to be inputted to said delaying circuit section or only a pulse to be outputted as said timing signal is to be inputted to said delaying circuit section.

3. The timing generator as set forth in claim 2, wherein said temperature compensation selecting section feeds a signal fixed to the logical value H as said pulse selecting signal to said pulse selection control section when only pulses to be outputted as said timing signal are to be inputted to said delaying circuit section.

4. A test apparatus for testing an electronic device, comprising:
   a pattern generating section for generating a test pattern to be fed to said electronic device;
   the timing generator according to claim 1;
   a waveform shaver for feeding said test pattern to said electronic device corresponding to said timing signal; and
   a judging device for judging whether said electronic device is defect-free based on an output signal outputted out of said electronic device.

5. A timing generator for generating a timing signal based on a given reference clock, comprising:

a delaying circuit section receiving the reference clock and outputting each pulse of the reference clock by delaying by a value of delay given per each of said pulse; and a temperature compensation selecting section for selecting whether all pulses of the reference clock are to be inputted to said delaying circuit section or only a pulse to be outputted as the timing signal is to be inputted to said delaying circuit section.

6. The timing generator of claim 5, further comprising a pulse selecting and outputting section connecting to an output of said delaying circuit section for passing and outputting only pulses to be outputted as the timing signal among the pulses outputted out of said delaying circuit section.

7. The timing generator of claim 6, wherein said temperature compensation selecting section receives:
   a pulse selecting signal which indicates a logical value H in passing the pulse in said pulse selecting and outputting section and indicates a logical value L in passing no pulse in synchronism with the pulse of the reference clock given to said delaying circuit section to feed the pulse selecting signal to said pulse selecting and outputting section;
   a signal fixed at the logical value H; and
   a temperature compensation selecting signal indicating whether the temperature is to be controlled in said delaying circuit section.

8. A test apparatus for testing an electronic device, comprising:
   a pattern generating section for generating a test pattern to be fed to the electronic device;
   a timing generator as set forth in claim 5;
   a waveform shaper for feeding the test pattern to the electronic device corresponding to the timing signal generated by said timing generator; and
   a judging device for judging whether the electronic device is defect-free based on an output signal of the electronic device.

* * * * *